US008610083B2

(12) United States Patent
Wang et al.

(10) Patent No.: US 8,610,083 B2
(45) Date of Patent: Dec. 17, 2013

(54) SYSTEMS AND METHODS PROVIDING ELECTRON BEAM WRITING TO A MEDIUM

(71) Applicant: Taiwan Semiconductor Manufacturing Company, Ltd., Hsin-Chu (TW)

(72) Inventors: Wen-Chuan Wang, Hsinchu (TW); Shy-Jay Lin, Jhudong Township (TW); Jaw-Jung Shin, Hsinchu (TW); Burn Jeng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/757,494

(22) Filed: Feb. 1, 2013

(65) Prior Publication Data
US 2013/0146780 A1  Jun. 13, 2013

Related U.S. Application Data

(63) Continuation of application No. 13/051,507, filed on Mar. 18, 2011, now Pat. No. 8,368,037.

(51) Int. Cl.
*H01J 37/317* (2006.01)
*H01J 37/30* (2006.01)
*G21K 5/00* (2006.01)

(52) U.S. Cl.
USPC .................. 250/398; 250/492.22; 250/492.1; 250/492.3; 250/310

(58) Field of Classification Search
USPC ............... 250/310, 311, 396 R, 398, 440.11, 250/442.11, 491.1, 492.22, 492.23, 492.3, 250/526
See application file for complete search history.

(56) References Cited

U.S. PATENT DOCUMENTS

| | | | |
|---|---|---|---|
| 4,021,674 A * | 5/1977 | Koops | 250/492.2 |
| 4,694,178 A | 9/1987 | Harte | |
| 6,667,486 B2 | 12/2003 | Ohta et al. | |
| 6,721,939 B2 | 4/2004 | Wang et al. | |
| 6,787,780 B2 * | 9/2004 | Hamaguchi et al. | 250/398 |
| 7,067,830 B2 | 6/2006 | Yoda et al. | |
| 8,148,702 B2 * | 4/2012 | Doering et al. | 250/492.22 |
| 8,368,037 B2 * | 2/2013 | Wang et al. | 250/492.22 |
| 2001/0028042 A1 * | 10/2001 | Hamaguchi et al. | 250/492.2 |
| 2001/0028043 A1 * | 10/2001 | Hamaguchi et al. | 250/492.3 |
| 2001/0028044 A1 * | 10/2001 | Hamaguchi et al. | 250/492.3 |
| 2001/0028046 A1 * | 10/2001 | Hamaguchi et al. | 250/492.23 |
| 2003/0189180 A1 * | 10/2003 | Hamaguchi et al. | 250/492.3 |
| 2003/0189181 A1 | 10/2003 | Ohta et al. | |
| 2006/0017021 A1 | 1/2006 | Yoda et al. | |
| 2010/0148087 A1 * | 6/2010 | Doering et al. | 250/396 R |

OTHER PUBLICATIONS

USPTO, Office Action, U.S. Appl. No. 13/051,507, Mar. 18, 2011, 11 pgs.

* cited by examiner

*Primary Examiner* — Bernard E Souw
(74) *Attorney, Agent, or Firm* — Haynes and Boone, LLP (57) ABSTRACT

A method for electron-beam writing to a medium includes positioning the medium within an e-beam writing machine so that the medium is supported by a stage and is exposed to an e-beam source. The method also includes writing a pattern to the medium using a plurality of independently-controllable beams of the e-beam source, in which the pattern comprises a plurality of parallel strips. Each of the parallel strips is written using multiple ones of the independently-controllable beams.

20 Claims, 9 Drawing Sheets

SYSTEMS AND METHODS PROVIDING ELECTRON BEAM WRITING TO A MEDIUM

CROSS-REFERENCE

This application is a continuation of U.S. Non-provisional patent application Ser. No. 13/051,507, filed on Mar. 18, 2011, entitled "Systems and Methods Providing Electron Beam Writing to a Medium," which is hereby incorporated by reference in its entirety.

BACKGROUND

The present disclosure relates generally to semiconductor manufacturing. Specifically, the present disclosure relates to systems and methods that write to a medium using electron beams.

Electron-beam (or "e-beam") writing relates to a process for creating changes in a medium using e-beams. Specifically, some e-beam processes use e-beams to write designs onto mediums. Examples of mediums that can be written on with e-beams include semiconductor wafers and photomasks (e.g., fused silica and chrome masks). E-beam writing provides a way to create features on a medium where the features are smaller than a resolution limit for light.

Some conventional systems use a single-beam method to write designs to a photomask. In one conventional system, in order to mitigate the beam-stitching effect, multiple passes are made by a single beam to apply the desired dosages to the medium. Dosage refers to the amount of electron beam exposure at a given point or area, e.g., e-beam current multiplied by exposure time at a given area is a way to measure dosage. Assuming that the beam is kept at a constant current, dosage increases with a number of passes over an area. Furthermore, throughput is typically inversely proportional to dosage applied by a particular pass. Single-beam exposure methods may be undesirably slow for some applications; thus some applications are evolving to a massive beam exposure technique.

Conventional massive beam exposure techniques employ a single source with multiple apertures to generate parallel beams, where each of the parallel beams are individually controllable as to placement, size, dose, and blur. Also, the beams can be individually calibrated. In one conventional technique, a set of parallel beams are used to write parallel strips on a medium simultaneously. The beams are moved in the x-direction by deflection and in the y-direction by scanning movement of the medium to make a zigzag movement to apply a desired dosage and create the parallel strips.

However, one issue with conventional massive beam techniques is beam-to-beam variation, and without some way to ameliorate beam-to-beam variation, one or more of the strips may be different from other strips and/or deviate from the desired dosage. Precise calibration for all beams can be difficult, so some conventional techniques account for beam-to-beam variation by overlapping the writing zones between adjacent beams. The overlapped writing zones are referred to as stitches, and while not considered part of the strips, stitches are used to average beam-to-beam variation between adjacent beams.

The massive beam techniques can use Gaussian beams, where each beam is a single beam, or patterned beams, where each beam includes a set of sub-beams that are not individually controllable and are arranged in an array.

The above-described conventional techniques have some disadvantages. For instance, as mentioned above, techniques using single beams with multiple passes may be undesirably slow, i.e., throughput may not be high enough for some applications. Also, some conventional massive beam techniques using stitching may find throughput negatively affected by the time used to write in the overlapped areas. More efficient and effective e-beam writing is called for.

SUMMARY

The present disclosure provides for many different embodiments. In a first embodiment, a method for electron-beam writing to a medium includes positioning the medium within an e-beam writing machine so that the medium is supported by a stage and is exposed to an e-beam source. The method also includes writing a pattern to the medium using a plurality of independently-controllable beams of the e-beam source, in which the pattern comprises a plurality of parallel strips. Each of the parallel strips is written using multiple ones of the independently-controllable beams.

In another embodiment, an electron-beam writing system includes a stage upon which a medium may be placed and a writing mechanism to write upon the medium placed upon the stage. The writing mechanism includes an electron beam source operable to produce N independently-controllable beams, where N is an integer larger than 1. The system also includes a computer-based control system operable to write a pattern upon the medium in a plurality of parallel strips, each of the strips being written using multiple ones of the N independently-controllable beams.

In another embodiment a method for electron-beam writing to a medium includes positioning an e-beam source to write a plurality of strips onto the medium using N independently-controllable beams and writing to each of the strips using multiple ones of the N independently-controllable beams. Variations among the respective independently-controllable beams are averaged by writing to each strip using a unique subset of the N independently-controllable beams.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor manufacturing. Specifically, the present disclosure relates to e-beam writing systems and methods that employ multiple beams. While the examples herein discuss applying the techniques to write to photolithographic masks and semiconductor wafers, it is understood that the scope of embodiments can include any system for writing to any appropriate medium using e-beam technology.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
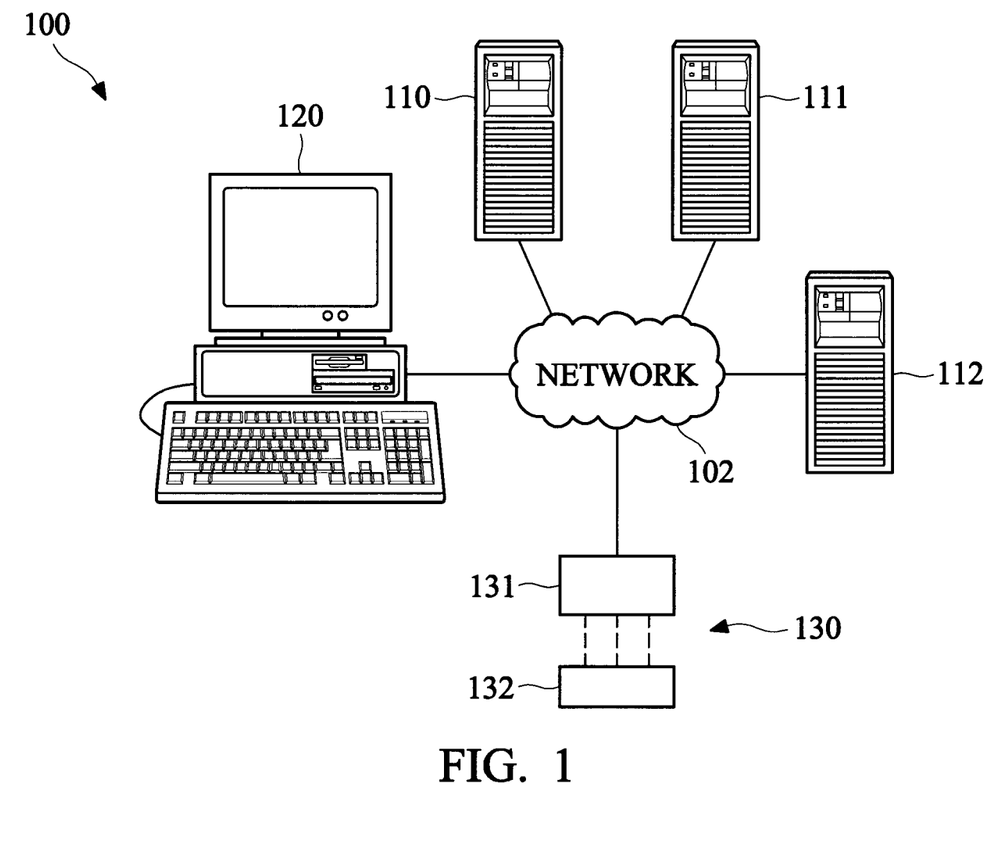
FIG. 1 is a simplified diagram of an exemplary network system in which embodiments may be implemented.

With reference now to the figures, FIG. 1 is a simplified diagram of a network system 100 in which embodiments may be implemented. Network system 100 includes a network 102 that provides a medium for communications between various devices and computers communicatively coupled by network system 100. Network 102 may be implemented as one or more of various networks, such as the Internet, an intranet, a local area network, a wide area network (WAN), or another network architecture that facilitates communications between network connected devices. Network 102 may include any one or more of various communication connections, such as wire, wireless, fiber optic, satellite links, or other communication media.

In the present example, various servers 110-112 are connected to network 102. In addition, a client 120 is connected to network 102. Servers 110-112 may be implemented as hypertext transfer protocol (HTTP) servers, file transfer protocol (FTP) servers, application servers, or other devices that provide data sources such as web pages or other content to client 120 connected therewith. Client 120 may be implemented as a personal computer, a portable computer, a network computer, a super computer, or another computational device.

Client 120 is connected to e-beam writing hardware 130, which receives files from client 120 and writes to a physical medium according to the data in the files. The data in the files includes layout patterns that are stored and transmitted in a layout description language such as GDS-II or OASIS. E-beam writing hardware 130 in this example includes writing mechanism 131, which includes a beam source and is operable to produce multiple beams simultaneously, and stage 132, which supports the medium. Either or both of stage 132 and writing mechanism 131 may move during a writing process to facilitate patterning. For purposes of the examples below, stage 132 is moved in the y-direction, and x-direction motion is provided by deflection, though the scope of embodiments is not so limited, as other methods of writing motion are possible.

Computers, such as client 120 and/or servers 110-112 may provide control and data to e-beam writing hardware 130 to facilitate writing of designs to the medium. For instance, one or more computers may control the movement of stage 132 and/or deflection during writing processes.

Figure 2:
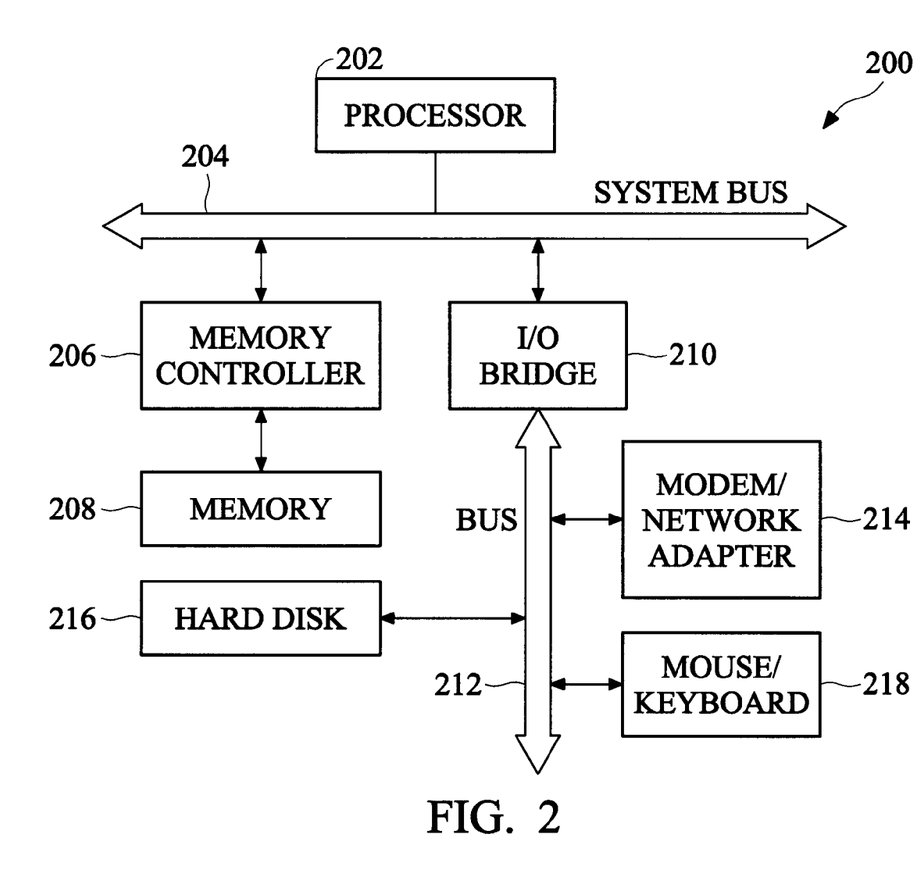
FIG. 2 is a simplified block diagram of an exemplary client computer system that may be configured to implement embodiments.

FIG. 2 is a simplified block diagram of a computer system 200, such as client 120 or any of servers 110-112 shown in FIG. 1, that may be configured to implement embodiments of an e-beam writing system. Computer system 200 includes a processor 202 interconnected with a system bus 204. System bus 204 provides couplings to subsystems and components of computer system 200. A memory controller 206 interconnected with a system memory 208 provides a communicative coupling between memory 208 and processor 202. Memory 208 may store executable instructions that provide writing functionality as described more fully below. An input/output bridge 210 may be connected with system bus 204, and one or more input/output devices may be connected with an I/O bus 212. For example, a hard disk 216 (or other memory, such as a flash drive) may provide non-transitory, non-volatile storage, and a modem or network adapter 214 may provide a communication interface that facilitates communication exchanges between computer system 200 and one or more data resources on a network. Additionally, user input devices, such as a mouse/keyboard 218, may be coupled with I/O bus 212 and facilitate user input to computer system 200. The configuration of computer system 200 is illustrative and is chosen only to facilitate an understanding of embodiments described herein.

Figure 3:
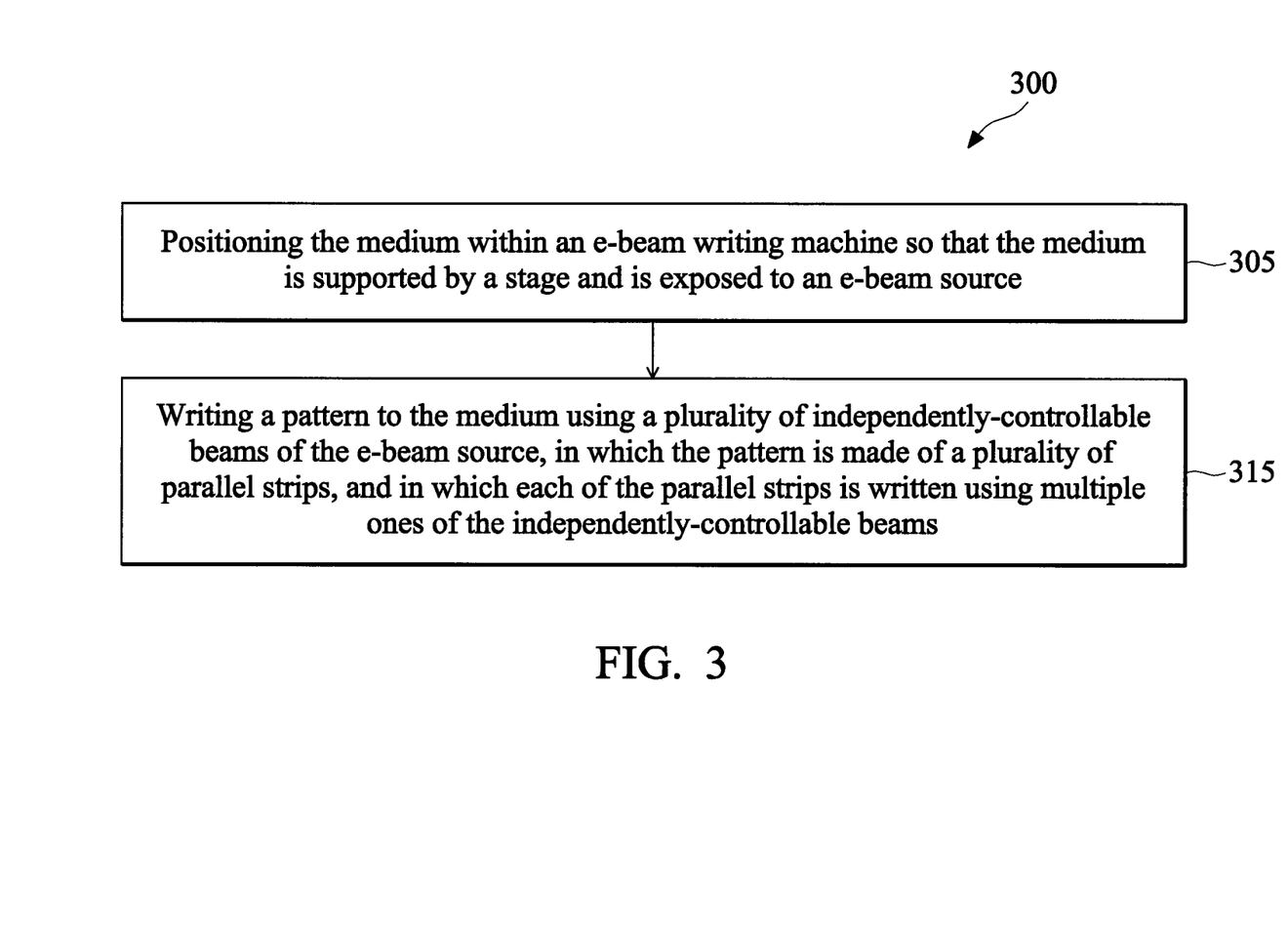
FIG. 3 is an illustration of an exemplary process for performing e-beam writing according to one embodiment.

FIG. 3 is an illustration of exemplary process 300 for performing e-beam writing according to one embodiment. Process 300 may be performed, for example, by one or more computers 110-112, 120 and e-beam writing hardware 130 of FIG. 1. In block 305, the medium is positioned within the e-beam writing machine so that it is supported by the stage and exposed to the e-beam writing source.

The system writes a pattern to the medium, where the pattern is made of multiple parallel strips. Block 305 may further include calibrating the e-beam source so that it can produce N independently-controllable beams, where N is an integer larger than one. Furthermore, block 310 may also include setting a placement, size, and dose for each of the beams.

In block 315, writing is performed on the medium using the N independently-controllable beams. In this example, each of the parallel strips is written using more than one of the beams, though perhaps fewer than all N beams.

Figure 4:
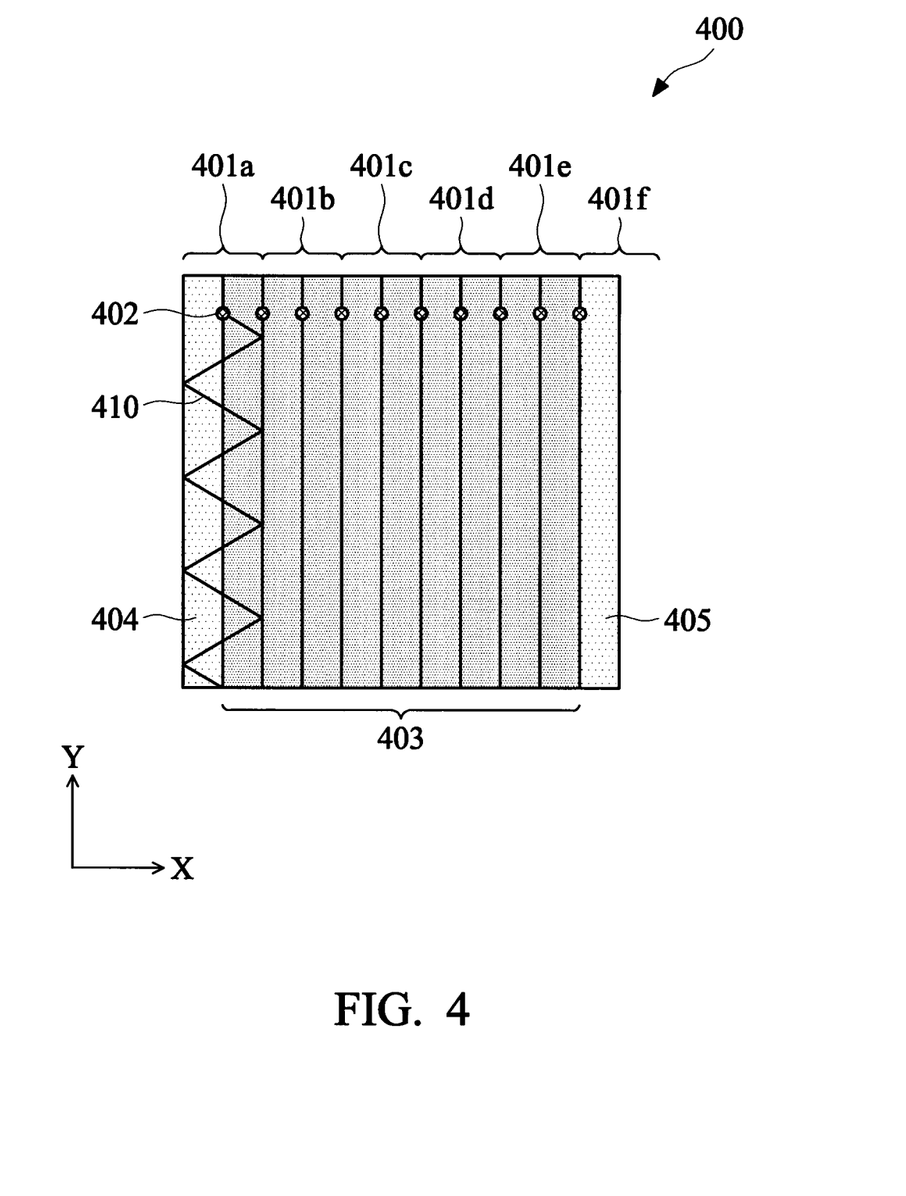
FIG. 4 shows an exemplary medium with strips thereon according to one embodiment.
Figure 5:
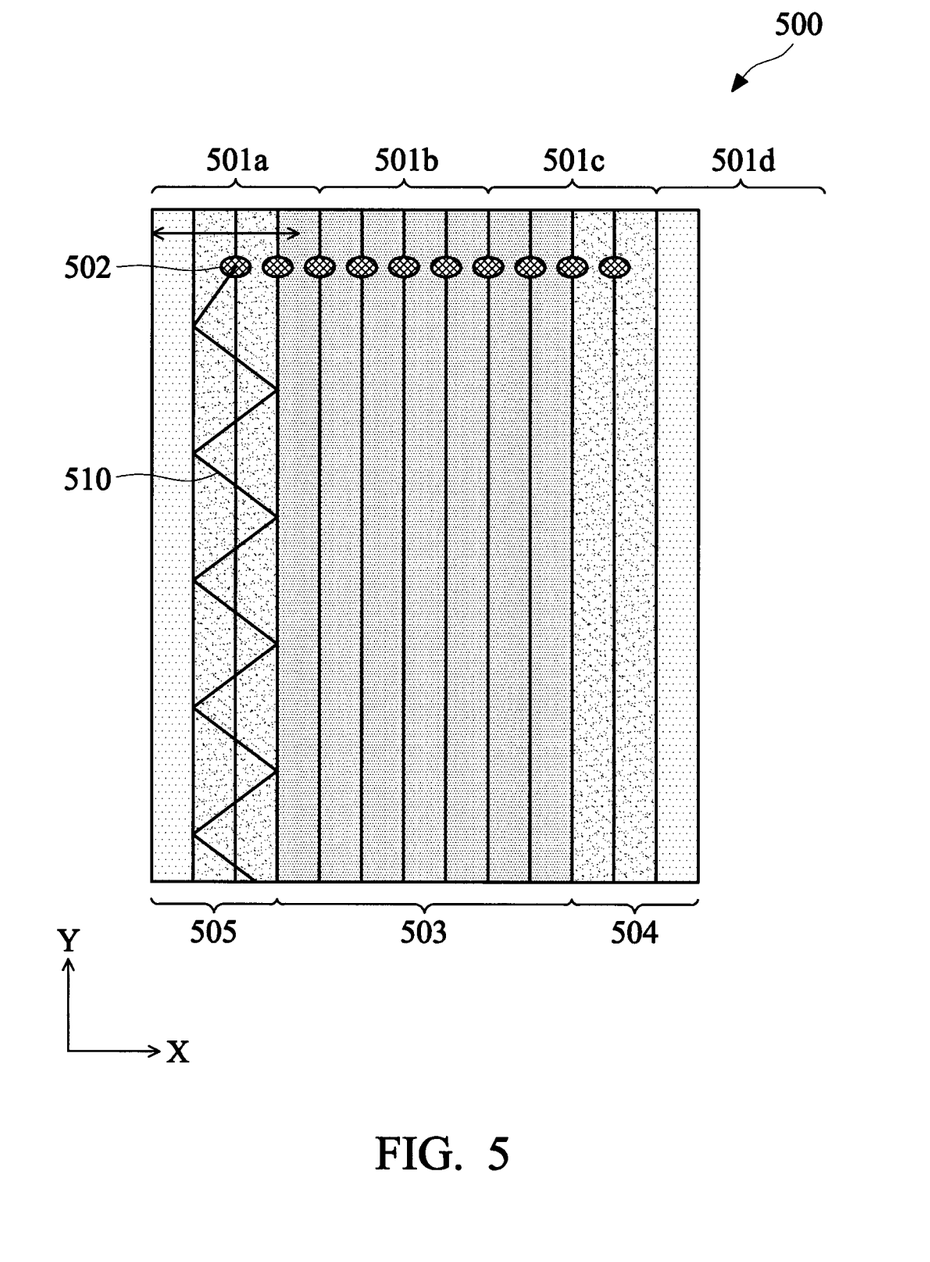
FIG. 5 is an illustration of a portion of an exemplary medium according to one embodiment.

Further in this example, each of the strips is an area of the medium with a single e-beam dosage, the effects of beam-to-beam variation notwithstanding. Example strips are shown in FIGS. 4 and 5. It is understood that beam-to-beam variation may cause dosage to vary somewhat within the bounds of a single strip; however, the use of multiple beams to write to a given strip mitigates the variation within a single strip and among multiple strips.

The e-beam writing process includes writing to a physical medium. In one example, the e-beam writing process is used to etch material from a semiconductor wafer in a design that facilitates the manufacture of structures on the wafer. In another example, the e-beam writing process is used to remove portions of a photomask that is made of, e.g., chrome and fused silica. The photomask can then be used in the manufacturing process of semiconductor devices. E-beam writing processes provide an effective way to create designs on a physical medium where some of the features of the design may be too small to be made by other conventional processes, such as photolithography.

The scope of embodiments is not limited to the example shown in FIG. 3. Other embodiments may add, omit, rearrange, or modify actions. For instance, some embodiments may repeat the actions of FIG. 3 many times to write multiple complex structures to the medium. Furthermore, other embodiments include subsequent processing steps appropriate for a photomask, semiconductor wafer, or other medium.

As shown below, some example embodiments include use of deflection to write a zigzag path using each of the beams. In other embodiments, either scanning or deflection is used to provide relative motion for writing. Still further, some embodiments employ Gaussian beams, whereas other embodiments employ patterned beams.

Moving to FIG. 4, a medium 400 with strips 401 thereon is depicted according to one embodiment during e-beam writing. Dot 402 represents a placement at a point in time of one e-beam, and other dots in FIG. 4 represent other e-beams similarly.

In FIG. 4, the area of each strip 401 is double exposed. Lines 410 show an example path traced by the e-beam of strip 401a. In FIG. 4, the stage (not shown) moves in the y-direction, and deflection is used to create relative movement in the x-direction. The result is the path represented by lines 410.

The dot adjacent dot 402 represents a beam that also writes to strip 401a in a manner similar to that described immediately above. The two beams together write strip 401a. Portions 404 and 405 are shown as not double exposed, though various embodiments include techniques to ensure that portions 404, 405 are double exposed. For instance, dummy exposures may be used to double expose portions 404, 405. Also, the stage can be used to position the medium to make further exposures where desired to provide consistent double exposure throughout medium 400. In some embodiments, the technique illustrated in FIG. 4 brings superior beam-to-beam uniformity than conventional stitching techniques discussed above. Of note in the embodiment of FIG. 4 is that each strip 401 is created using a unique set of beams.

In some embodiments, throughput is not adversely affected by tying up double the beams on a single set of strips. If the desired dose for a strip 401 is one unit, the beams can be kept at one current unit while doubling writing speed to two speed units. Since each strip 401 is double exposed, the cumulative dose for each strip is one unit, and it is performed in one-half time unit because the writing velocity is doubled. The beams can then be moved to a different but similarly-sized portion of the medium to write a unit dose in another one-half time unit. Thus, the beams can be fully utilized in a given time unit. A rule of thumb for some embodiments is that velocity is increased by a factor equal to the exposure factor so as to achieve the same throughput.

FIG. 5 is an illustration of portion 500 of a medium according to one embodiment during e-beam writing. In the example of FIG. 5, strips 501 are quadruple exposed by the end of the process, and line 510 shows an example path written by a beam that is represented by dot 502. Strips 501a, 501c, and 501d are shown as having less than quadruple exposure. Only strip 501b falls within quadruple exposure area 501, whereas strips 501a, 501c, and 501d fall within exposure areas 504, 505 with less than quadruple exposure. As explained above with respect to FIG. 4, various techniques may be used to provide consistent quadruple exposure. For instance, in one example, dummy exposures may be added to strips 501a, 501c, and 501d.

Additionally and/or alternatively, the beams can be moved to the right or to the left adjacent the end beam on that side, where writing is begun. For instance, in the present example, there are ten beams represented by ten dots 502. After the beams have traversed the medium, the stage can be moved to position the medium so that the ten beams are moved in the x-direction ten places and begin writing to the immediate right (or left) of the original ten beams, thereby writing additional strips and providing quadruple exposure to areas 504 (and/or 505). Such operation can be performed in any embodiment using any number of beams per strip.

Once again, the operation illustrated by FIG. 5 may be performed to have no negative impact on throughput. For instance, similarly to the operation described above for FIG. 4, the writing speed can be increased by the exposure factor. In fact, in the embodiments of FIGS. 4 and 5, the writing speed can be changed by any arbitrary factor to increase or decrease throughput as appropriate.

Figure 6:
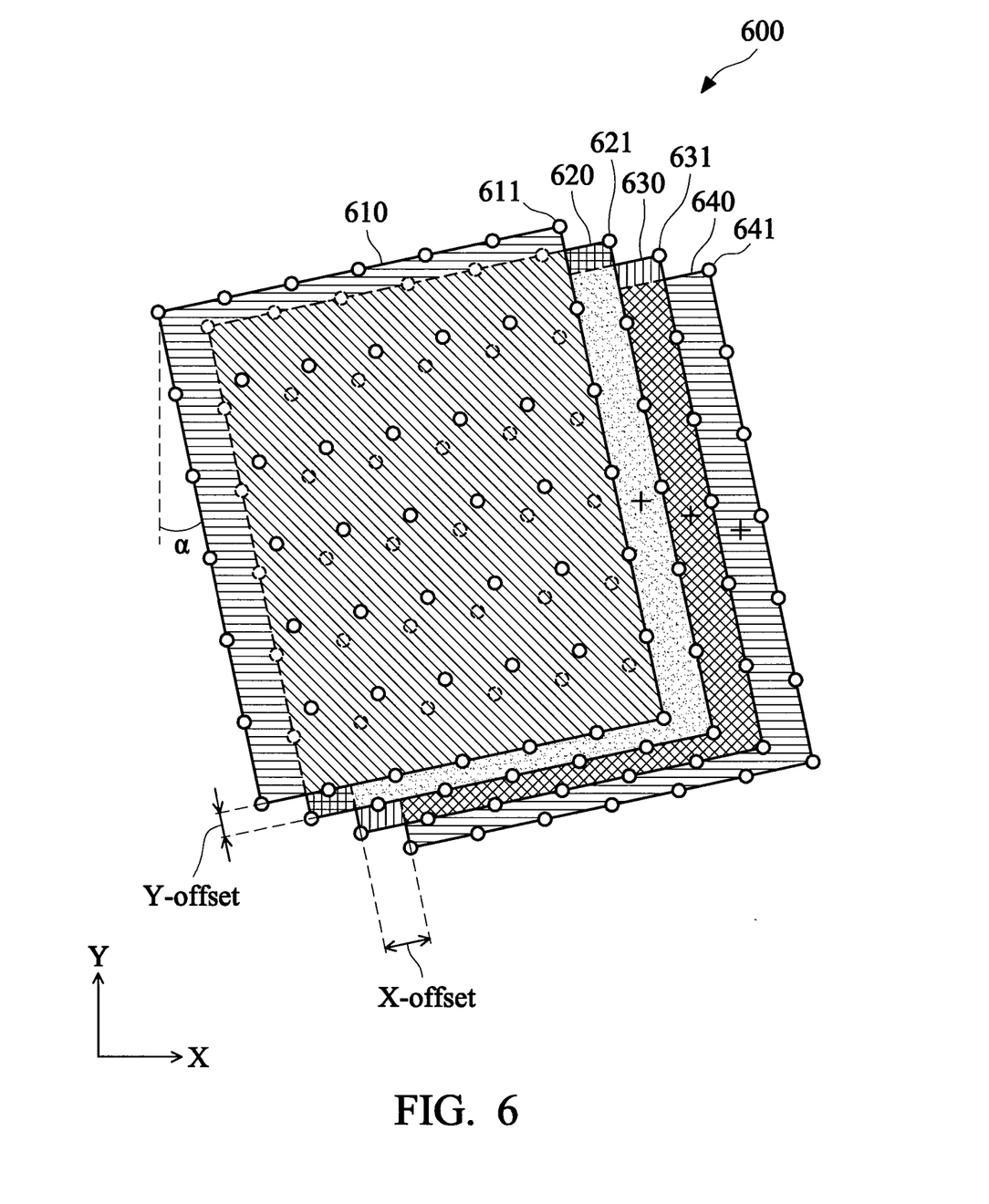
FIG. 6 is an illustration of an exemplary beam arrangement for use with an embodiment.

FIG. 6 is an illustration of exemplary beam arrangement 600 for use with an embodiment. Beam arrangement 600 includes four independently-controllable beams 610, 620, 630, 640. Each of the independently-controllable beams 610, 620, 630, 640 includes an M×M array of sub-beams, where M is an integer greater than one (and in this case is equal to seven). In other embodiments, M can be any arbitrary integer greater than one.

The sub-beams are illustrated in FIG. 6 by exemplary sub-beams 611 (in beam 610), 621 (in beam 620), 631 (in beam 630), and 641 (in beam 640). The sub-beams themselves are not independently-controllable.

Beam 640 is overlaid by beam 630, which is overlaid by beam 620, which is overlaid by beam 610. Between each adjacent beam there is an x-y offset so that the beams 610, 620, 630, 640 do not lay directly on top of each other. Furthermore, there is an angular offset, alpha, with respect to a direction of scanning (in this case, it assumed that the direction of scanning is along the y-direction). Furthermore, in this embodiment, x-direction movement is not used when scanning a given strip, so that the movement relevant to the discussion of FIGS. 6 and 7 is the y-direction movement.

Figure 7:
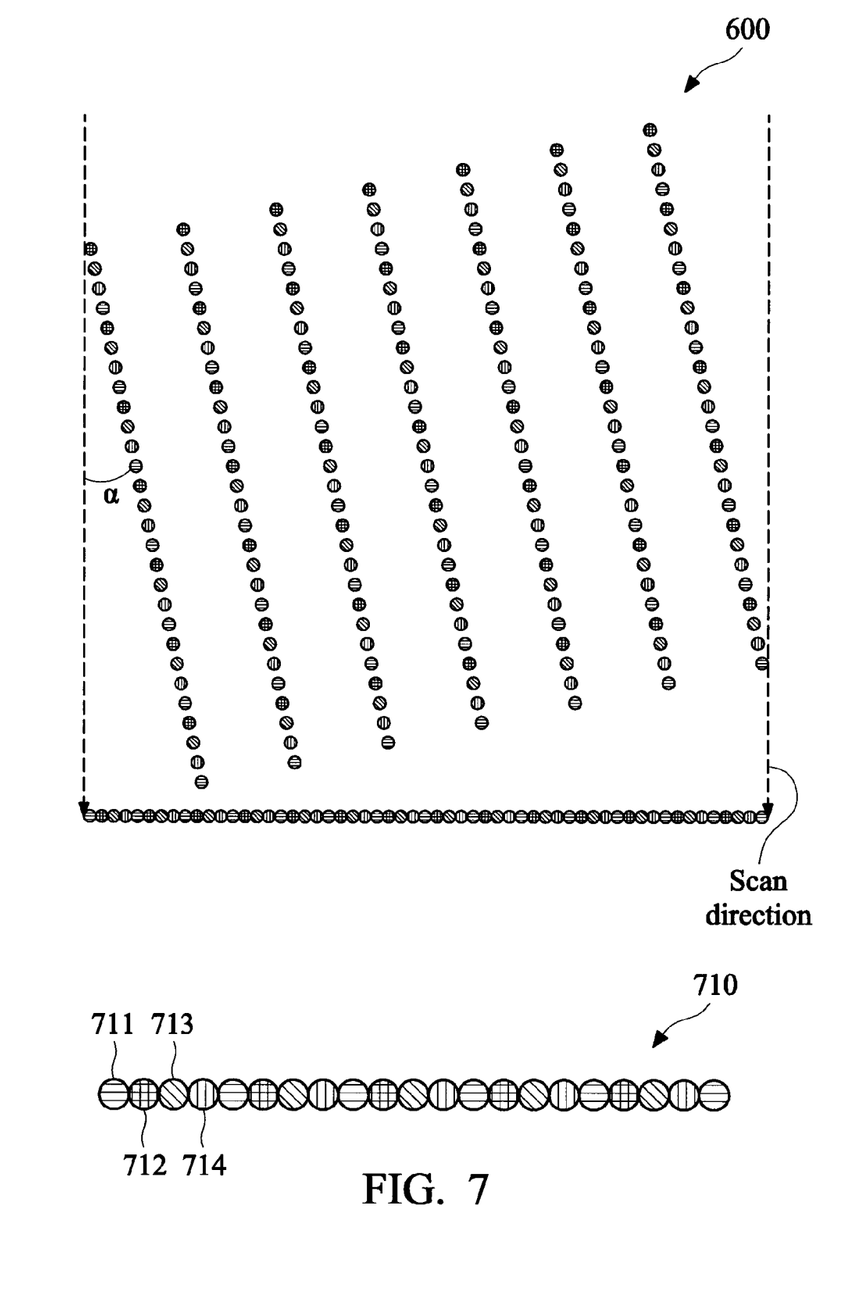
FIG. 7 is an illustration of the beam arrangement of FIG. 6 shown to emphasize the individual pixels of the sub-beams, where each dot in FIG. 7 represents a sub-beam.

FIG. 7 is an illustration of beam arrangement 600 shown to emphasize the individual pixels covered by the sub-beams, where each dot in FIG. 7 represents a sub-beam. The dots in FIG. 7 are an aggregation of the four 7×7 arrays of sub-beams shown in FIG. 6, for a total of 196 sub-beams. FIG. 7 also illustrates an exemplary scan direction and an angular offset. During writing, the beams are projected onto the medium as shown in FIGS. 6 and 7, and the medium is moved relative to the beam sources to provide scanning movement. The beams 610, 620, 630, 640, are performed simultaneously in this example.

View 710 is an illustration of the projection of the pixels along a line perpendicular to the scan direction. The x-y offset and angular offset produce a configuration wherein adjacent pixels are from different beams. In the case of view 710, the first pixel is from beam 610, the second pixel is from beam 620, the third pixel is from beam 630, and the fourth pixel is from beam 640. The placement then repeats across the view in the x-direction. View 710 illustrates that a strip written by beam arrangement 600 includes contributions from four different beams 610, 620, 630, 640, and the sub-beams of those beams are distributed in a way that averages out the beam-to-beam variation among beams 610, 620, 630, 640.

Figure 8:
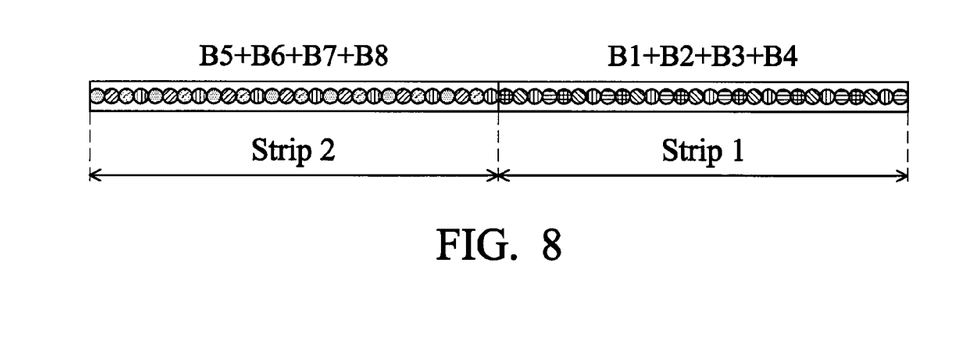
FIG. 8 shows an exemplary pixel projection along the x-direction according to one embodiment consistent with the examples above for FIGS. 6 and 7.

FIG. 8 is an exemplary pixel projection along the x-direction according to one embodiment consistent with the examples above for FIGS. 6 and 7. In the embodiments of FIGS. 6-8, each strip is covered by multiple independent beams, and adjacent pixels are exposed by different beams. In FIG. 8, strip 1 is exposed by a set of four independent beams, and strip 2 is exposed by a different set of four independent beams. While not shown in FIG. 8, it is noted that different sets of beams can be used to expose either or both of strips 1 and 2 in subsequent exposures. The subsequent exposures can further reduce the effects of beam-to-beam variation and also enable gray-level writing.

In FIG. 8, the x-y and angular offsets combine to make a cumulative offset substantially equal to one pixel width. The one-pixel-width offset creates the pattern shown in FIGS. 7 and 8, where the pixels have a repeating pattern along the x-direction (perpendicular to the y-direction scanning).

Figure 9:
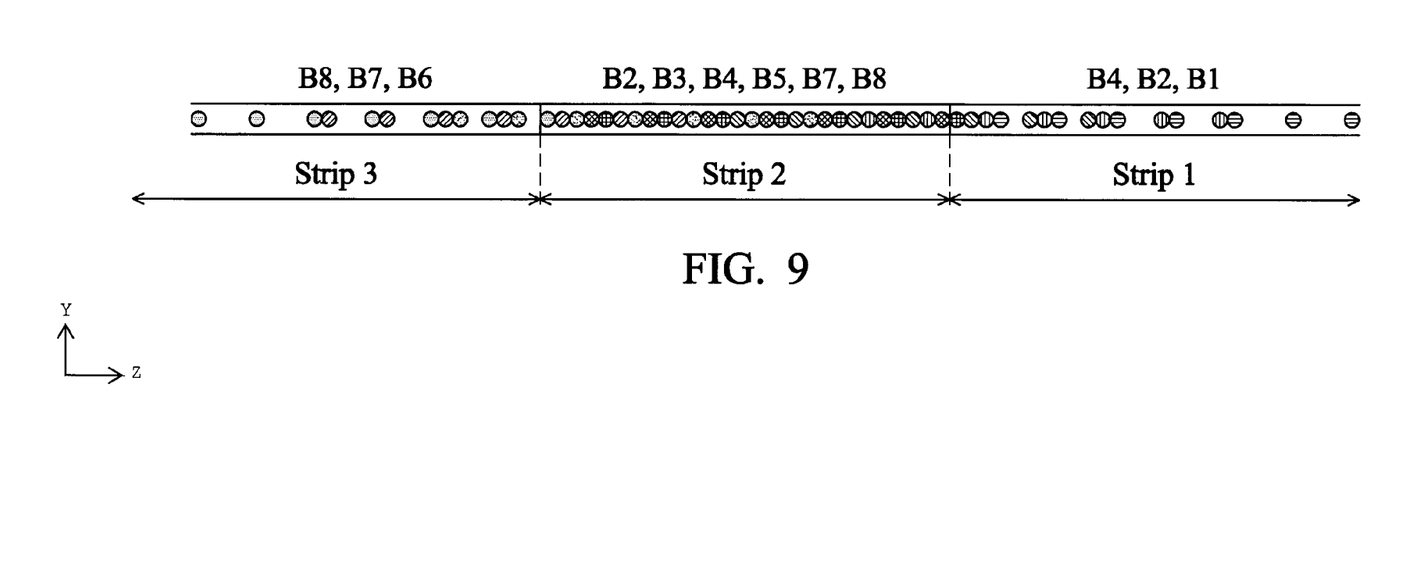
FIG. 9 is an illustration of an exemplary x-direction projection according to one embodiment that uses a beam-to-beam offset greater than one pixel width.

Other embodiments may use a cumulative beam-to-beam offset that is greater than one pixel width. FIG. 9 is an illustration of an exemplary x-direction projection according to one embodiment that uses a beam-to-beam offset greater than one pixel width. The combination of beams to cover a given strip is not fixed or regular in the example of FIG. 9. Each strip is exposed by different combinations of individual beams, which further mitigates the effects of beam-to-beam variation. Strips 1 and 3 are shown as being not exposed with the same dose as strip 2, but it is understood that the number of strips extends beyond strip 1 and strip 3, and beams writing those additional strips (not shown) add pixels to strips 1 and 3 to apply a consistent exposure.

The examples above in FIGS. 6-9 show example embodiments using four or eight beams, though the scope of embodiments is not so limited. Rather, various embodiments may include any arbitrary number of beams. Furthermore, x- and y-directions are used purely for illustration and do not limit the various embodiments to any particular orientation.

Figure 10:
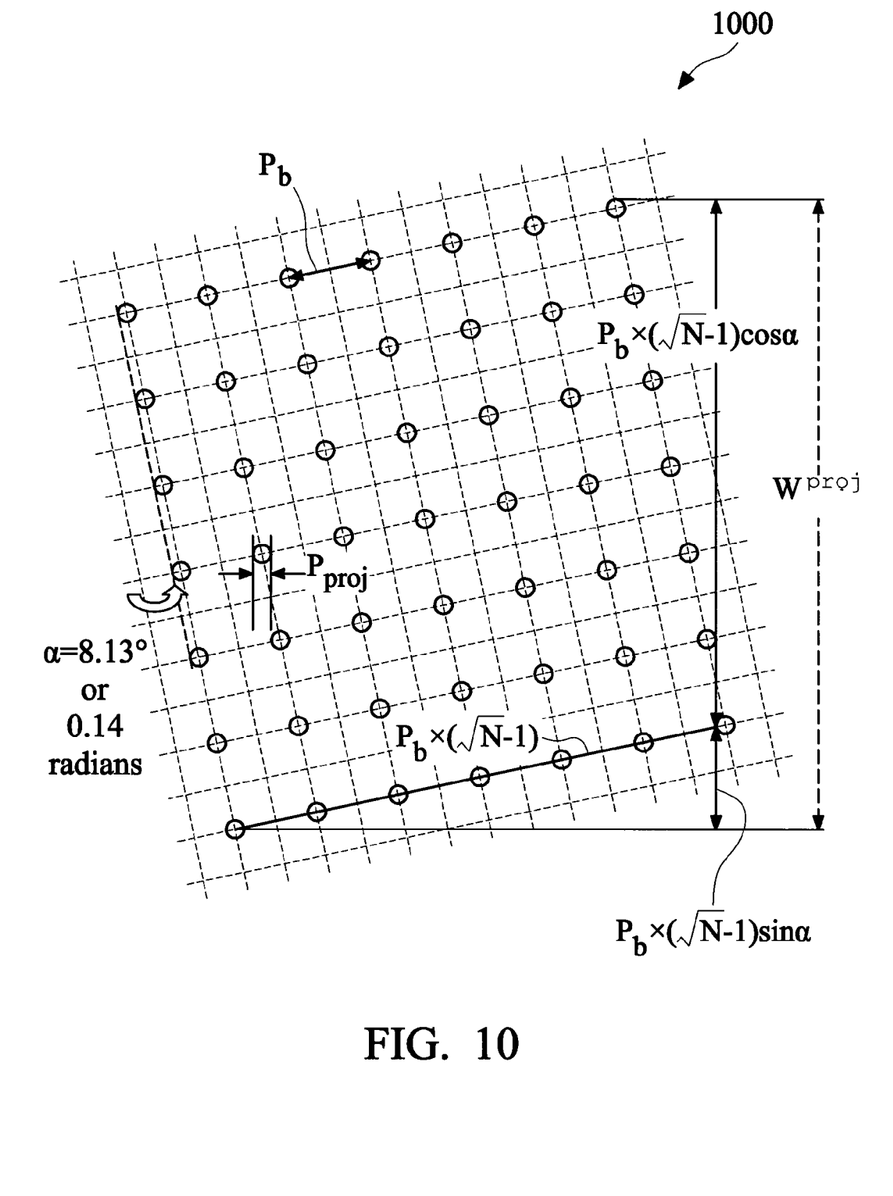
FIG. 10 is an illustration of a 7×7 array of sub-beams for use with the embodiments of FIGS. 6-9.

FIG. 10 is an illustration of a 7×7 array 1000 of sub-beams for use with the embodiments of FIGS. 6-9. Pb is a spacing between sub-beams in array 1000. Pproj is a width of a sub-beam as it is projected onto the medium. Alpha is the angular offset. In this example, a pixel size is 3.5 nm. The equations below show the area covered per scan in this example. It is noted that the e-beam current and the writing speed can be adjusted in view of the below equations to have a desired effect on throughput. The numbers below are for illustration only and do not limit the scope of embodiments.

consider $P_{proj}$ is the multiple of 3.5 nm pixel size $$P_{proj} = P_b \cdot \sin(\alpha_{array}) = 10.5 \text{ nm} = 3 \times 3.5 \text{ nm}$$

$$\Rightarrow P_b = 74.25 \text{ nm}$$

Beam Shift = 1 pixel

If $w_{proj}$ = Strip Width $$N_{subbeams} \text{ along } w_{proj} = \frac{w_{proj}}{PixSize} = \frac{504 \text{ nm}}{3.5 \text{ nm}} = 144$$

$$N_{beams} \text{ for 1 Strip} = \frac{N_{subbeams} \text{ along } w_{proj}}{N_{subbeams} \text{ array}} = \frac{144}{7} = 21$$

$$N_{strip} \text{ per Scan} = \frac{\text{Total Beam Number}}{N_{beams} \text{ for 1 Strip}} = \frac{13000}{21} = 619$$

Area Covered per Scan = $N_{strip}$ per Scan × $w_{proj}$
= 619 × 504 nm
= 0.312 mm Various embodiments may include advantages over other techniques. For instance, various embodiment write to each strip using multiple beams, thereby helping to average out beam-to-beam variation without stitching. It is understood that the embodiments illustrated above may not in all scenarios completely eliminate beam-to-beam variation. However, it is enough for many applications that the beam-to-beam variation is mitigated by use of multiple beams per strip.

Furthermore, as explained above, parameters (e.g., e-beam current and writing speed) can be adjusted so that the effect on throughput is not negative in some instances. Additionally, some embodiments perform gray-level writing by applying the multi-pass writing technique described above.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for electron-beam writing to a medium comprising:
    positioning the medium within an e-beam writing machine so that the medium is supported by a stage and is exposed to an e-beam source; and
    writing a pattern to the medium using a plurality of independently-controllable beams of the e-beam source, in which the pattern comprises a plurality of parallel strips, and further in which each of the parallel strips is written using multiple ones of the independently-controllable beams to cause multiple beam exposure to areas within each of the parallel strips.

2. The method of claim 1 in which the strips are not separated by stitches.

3. The method of claim 1 in which each of the independently-controllable beams comprises a Gaussian beam.

4. The method of claim 1 in which each of the independently-controllable beams are applied in a zigzag configuration.

5. The method of claim 4 in which each of the independently-controllable beams has a zigzag pattern that overlaps with at least one adjacent beam.

6. The method of claim 1 in which a writing velocity of the independently-controllable beams is increased by a factor of N, where N is an integer equal to a number of the independently-controllable beams that write to a single one of the strips.

7. The method of claim 1 in which the medium comprises a semiconductor wafer.

8. The method of claim 1 in which medium comprises a photomask.

9. The method of claim 1 in which each of the strips comprises a single, respective e-beam dosage.

10. The method of claim 1 in which the independently-controllable beams are applied using at least one of: e-beam deflection and relative movement of the medium to the e-beam source.

11. An electron-beam writing system, the system comprising:
    a stage upon which a medium may be placed;
    a writing mechanism to write upon the medium placed upon the stage, the writing mechanism comprising an electron beam source operable to produce N independently-controllable beams, where N is an integer larger than 1; and
    a computer-based control system operable to:
        write a pattern upon the medium in a plurality of parallel strips, each of the strips being written using multiple ones of the N independently-controllable beams to cause multiple beam exposure to areas within each of the parallel strips.

12. The system of claim 11 in which the independently-controllable beams comprise Gaussian beams, and in which the computer-based control system writes with the Guassian beams using movement in x- and y-directions.

13. The system of claim 11 in which each of the independently-controllable beams are applied in a zigzag configuration.

14. The system of claim 11 in which each of the independently-controllable beams has a zigzag pattern that overlaps with at least one adjacent beam.

15. The system of claim 11 in which the independently-controllable beams are applied using at least one of: e-beam deflection and relative movement of the medium to the electron beam source.

16. A method for electron-beam writing to a medium, the method comprising:
    positioning an e-beam source to write a plurality of strips onto the medium using N independently-controllable beams; and
    writing to each of the strips using multiple ones of the N independently-controllable beams, variations among the respective independently-controllable beams being averaged by writing to each strip using a unique subset of the N independently-controllable beams, further in which the strips are not separated by stitches, and further in which the strips are part of a complete pattern that does not require stitches.

17. The method of claim 16 in which each of the independently-controllable beams comprises a Gaussian beam.

18. The method of claim 17 in which each of the independently-controllable beams is written in a zigzag path in each strip using at least one of deflection and relative movement of the medium and the e-beam source.

19. The method of claim 16 in which the independently-controllable beams each comprise a patterned beam with an array of M×M non-independent sub-beams, the independently-controllable beams being overlayed with an offset relative to each other and an angular offset relative to a direction of scanning so that a projection of the independently-controllable beams on the medium has a pattern in which adjacent pixels are from different ones of the independently-controllable beams.

20. The method of claim 16 in which a motion of the independently-controllable beams uses straight-line scanning and wherein, for each of the plurality of strips, the independently-controllable beams are applied simultaneously.

* * * * *